(12) United States Patent
Chandhok et al.

(10) Patent No.: US 7,109,504 B2
(45) Date of Patent: Sep. 19, 2006

(54) EXTREME ULTRAVIOLET ILLUMINATION SOURCE

(75) Inventors: Manish Chandhok, Beaverton, OR (US); Eric Panning, Hillsboro, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 10/882,784

(22) Filed: Jun. 30, 2004

(65) Prior Publication Data

US 2006/0017024 A1 Jan. 26, 2006

(51) Int. Cl.
*H01J 35/00* (2006.01)

(52) U.S. Cl. .................. 250/504 R; 250/251; 378/119; 378/121; 315/111.81; 315/111.91; 204/158.2

(58) Field of Classification Search ...................... None
See application file for complete search history.

(56) References Cited

U.S. PATENT DOCUMENTS 6,590,959 B1 * 7/2003 Kandaka et al. ............ 378/119
6,804,327 B1 * 10/2004 Schriever et al. ........... 378/119
2004/0071267 A1 * 4/2004 Jacob et al. ................. 378/119

OTHER PUBLICATIONS

Hutcheson, G., "The First Nanochps," *Scientific American*, Apr. 2004, pp. 76-83.
Stix, G., "Getting More from Moore's," Scientific American.com, Apr. 17, 2001, 6 pgs.

* cited by examiner

*Primary Examiner*—John R. Lee
*Assistant Examiner*—Zia R. Hashmi
(74) *Attorney, Agent, or Firm*—Rahul D. Engineer

(57) ABSTRACT

According to a first embodiment of the invention, a dual cathode electrode for generating EUV light is disclosed. The dual cathode electrode may include a first outer cathode, a second inner cathode, and an anode disposed between the inner and outer cathodes. The dual cathode electrode also includes a plasma disposed in between the cathodes that emits EUV photons when it is excited by an arc between the anode and the cathodes. According to a second embodiment of the invention, several Dense Plasma Focus (DPF) electrodes are placed along a circle. The DPF electrodes, when activated, will emit electron photons from the circle in which they are placed thereby avoiding obscuration used to protect UV mirrors against debris.

25 Claims, 5 Drawing Sheets

100

302

300

400

500

EXTREME ULTRAVIOLET ILLUMINATION SOURCE

FIELD OF THE INVENTION

The present invention generally relates to semiconductor processing, and specifically relates to an improved Extreme Ultraviolet (EUV) illumination source.

BACKGROUND

Integrated Circuits (ICs) generally comprise many semiconductor features, such as transistors, formed on a semiconductor substrate. The patterns used to form the devices may be defined using a process known as photolithography. Using photolithography, light is shone through a pattern on a mask, transferring the pattern to a layer of photoresist on the semiconductor substrate. The photoresist can then be developed, removing the exposed photoresist and leaving the pattern on the substrate. Various other techniques, such as ion implantation, etching, etc. can then be performed to the exposed portion of the substrate to form the individual devices.

To increase the speed of ICs such as microprocessors, more and more transistors are added to the ICs. Therefore, the size of the individual devices must be reduced. One way to reduce the size of individual features is to use short wavelength light during the photolithography process. According to Raleigh's Law ($R=k*\lambda/NA$, where k is a constant, and NA=Numerical Aperture, and R is the resolution of features), a reduction in the wavelength of the light proportionately reduces the size of printed features.

Extreme ultraviolet (EUV) light (e.g., 13.5 nm wavelength light) is now being used to print very small semiconductor features. For example, EUV can be used to print isolated features that are 15–20 nanometers (nm) in length, and nested features and group structures that have 50 nm lines and spaces. EUV lithography is targeted to meet the requirements of a 50 nm half-pitch, where pitch is equal to line plus feature size. Since EUV light has such a short wavelength, it is easily absorbed, even by air. Therefore, EUV photolithography is performed in vacuum using multilayer-coated reflective optics.

EUV photons can be generated by the excited the atoms of a plasma. One way to generate the plasma is to project a laser beam on to a target (droplet, filament jet) creating a highly dense plasma. When the excited atoms of the plasma return to a stable state, photons of a certain energy, and thereby a certain wavelength, are emitted. The target may be, for example, Xenon, Tin, or Lithium. Another way to produce EUV photons is to create a pinch plasma between two electrodes with the target material in a gaseous form between the two electrodes, thereby exciting the atoms.

EUV photons have a very short wavelength. For example, a typical EUV illumination source may generate 13.5 nanometer (nm) photons. The short wavelength of these photons causes the light generated by the illumination source to be easily absorbed, even by air. As a result, mirrors, rather than lenses, are used to focus light generated by EUV illumination sources.

A dense plasma focus (DPF) electrode may be used to generate EUV photons. The DPF electrode includes an anode, a cathode, and a plasma disposed between the anode and the cathode. When an arc is generated between the anode and the cathode, the individual atoms of the plasma are excited and generate EUV photons.

A DPF electrode may generate physical debris because of Brownian movement. To protect the focusing mirrors, a disc-shaped foil obscuration is placed in front of the electrode. However, the obscuration absorbs a large portion of the relatively little light energy generated by the DPF electrode.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein is an EUV Illumination Source. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to a first embodiment of the invention, an EUV illumination source is an electrode having two cathodes and one anode disposed in between the two cathodes. The electrode, according to the first embodiment of the invention, includes an inner cathode and an outer cathode that are concentrically aligned. A ring-shaped anode is disposed in between the two cathodes. A plasma is disposed between the two cathodes. When a voltage is applied in between the anode and the two cathodes, the plasma is excited, and as a result generates EUV photons. The focusing mirrors collect a larger proportion of the generated EUV photons since the plasma generating the photons is located toward an outer circumference of the electrode.

According to a second embodiment of the invention, several dense plasma focus (DPF) electrodes are arranged in a circle. By arranging the several electrodes in a circle, the electrodes may be aimed around the obscuration to improve transmission of the EUV photons generated by the electrodes. The electrodes may further be angled to strike the mirrors at an advantageous angle so that the mirrors collect more of the incident photons.

Figure 1:
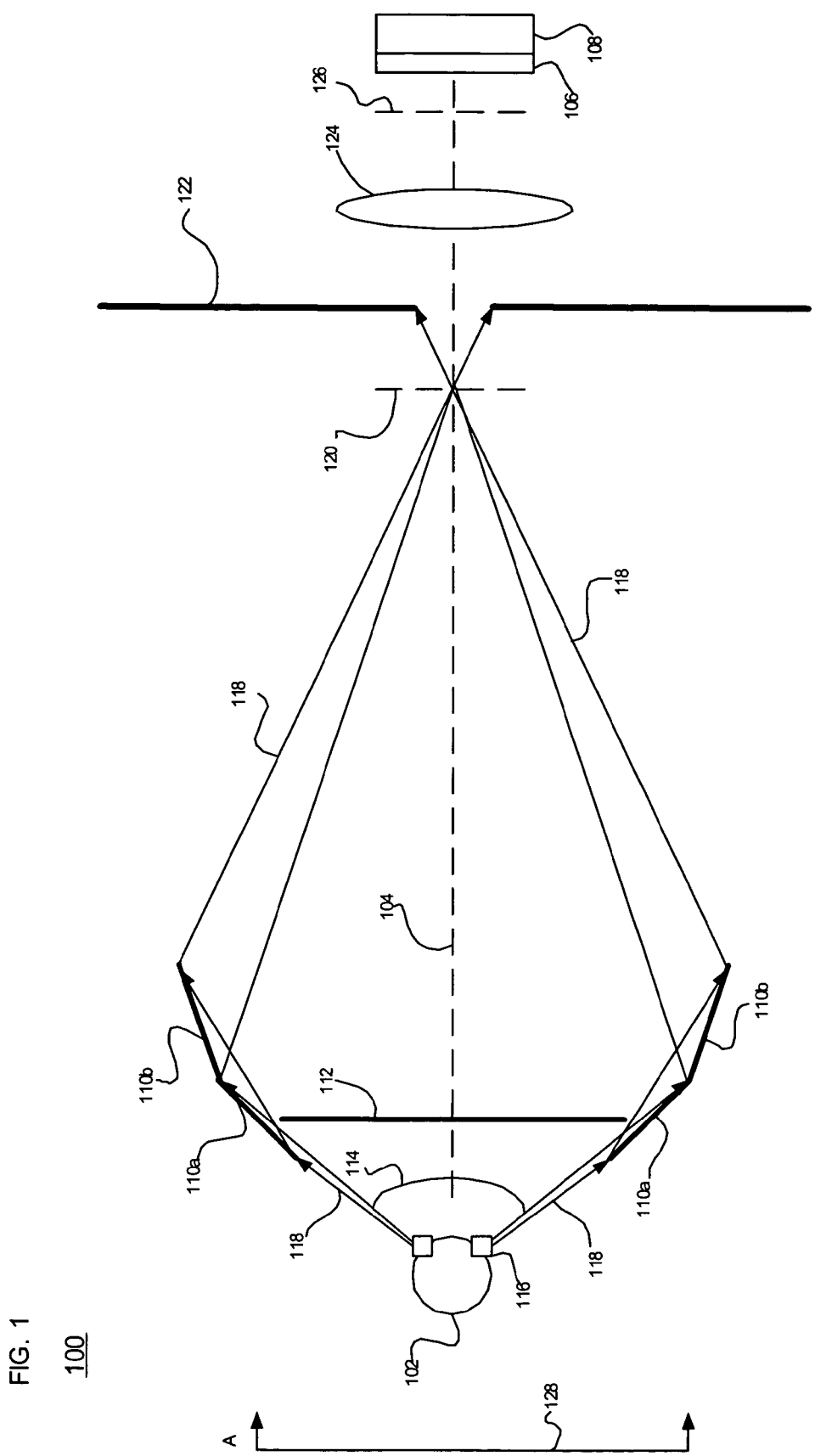
FIG. 1 is a side view of a system for performing photolithography using EUV photons according to an embodiment of the invention.

FIG. 1 is a side view of a system 100 for performing photolithography using EUV photons. A source plasma 102 is aligned on an optic axis 104 to print onto a layer of photoresist 106 disposed on a semiconductor substrate 108. Because of Brownian movement, the source plasma 102 generates debris which can damage a set of mirrors 110. The physical debris generated by the plasma is a side effect of the process used to generate the EUV photons, and can damage the delicate optics needed to perform EUV photolithography. Therefore, an obscuration 112 is placed in front of the source plasma 102 to prevent the debris from contacting the mirrors 110. The obscuration 112 may be a disc comprising a foil such as a gold foil.

An angle 114 shows the range of the light that is not collected by the mirrors 110 because of the obscuration 112. As shown, the source plasma may comprise an electrode 116. The electrode 116 may comprise one of the embodiments described herein. As can be seen, light rays 118 emanating from the electrode 116 are incident at such an angle so as to avoid the obscuration 112. This is because the electrode 116 is constructed so that light is generated only from an outer ring of the electrode 116, rather than from the entire surface of the electrode 116.

The mirrors 110 may comprise two segments, a first hyperboloid mirror segment 110a, and a second ellipsoid segment 110b. It is understood however, that any type of mirror 110 may be used as necessitated by the specific application. After the rays 118 are generated by the source plasma 102, they are reflected by the mirrors 110 toward a source image plane 120. The source image plane 120 is where the source image forms. The rays 118 then pass through a field stop 122 and through a condenser 124. The field stop 122 "stops" a portion of the incoming rays 122, only allowing through the portion that can be collected by the condenser 124. The condenser 124 may perform several functions including collimating, or parallelizing, the light rays 118, shaping the light rays 118, and spreading the light rays 118.

After passing through the condenser 124, the light rays 118 encounter a reticle 126. The reticle 126 masks the incoming light rays 118 before they expose the photoresist 106. The reticle 126 includes a pattern that is to be transferred onto the photoresist 106. After the photoresist 106 has been exposed by the light rays 118, the photoresist 106 is developed and the desired portions of the underlying substrate 108 are exposed. The exposed portions of the substrate 108 can then be processed using known techniques such as ion implantation and etching. These processes can be used to form semiconductor devices such as transistors, diodes, etc.

Either of the electrodes described herein may be used as the electrode 116. The electrodes described herein generate photons near their outer perimeter so that more light is collected by the mirrors 110. Generally, only a small portion of the energy that is used to generate EUV photons results in actual light energy transmitted to the photoresist 106. For example, several kilowatts of electricity may be used to activate the electrodes to generate only a few watts of EUV energy. Therefore, by generating the EUV photons near the perimeter of the electrode 116 where it is more likely to be collected by the mirrors 110, the EUV photolithography process is more reliable and efficient.

Figure 2:
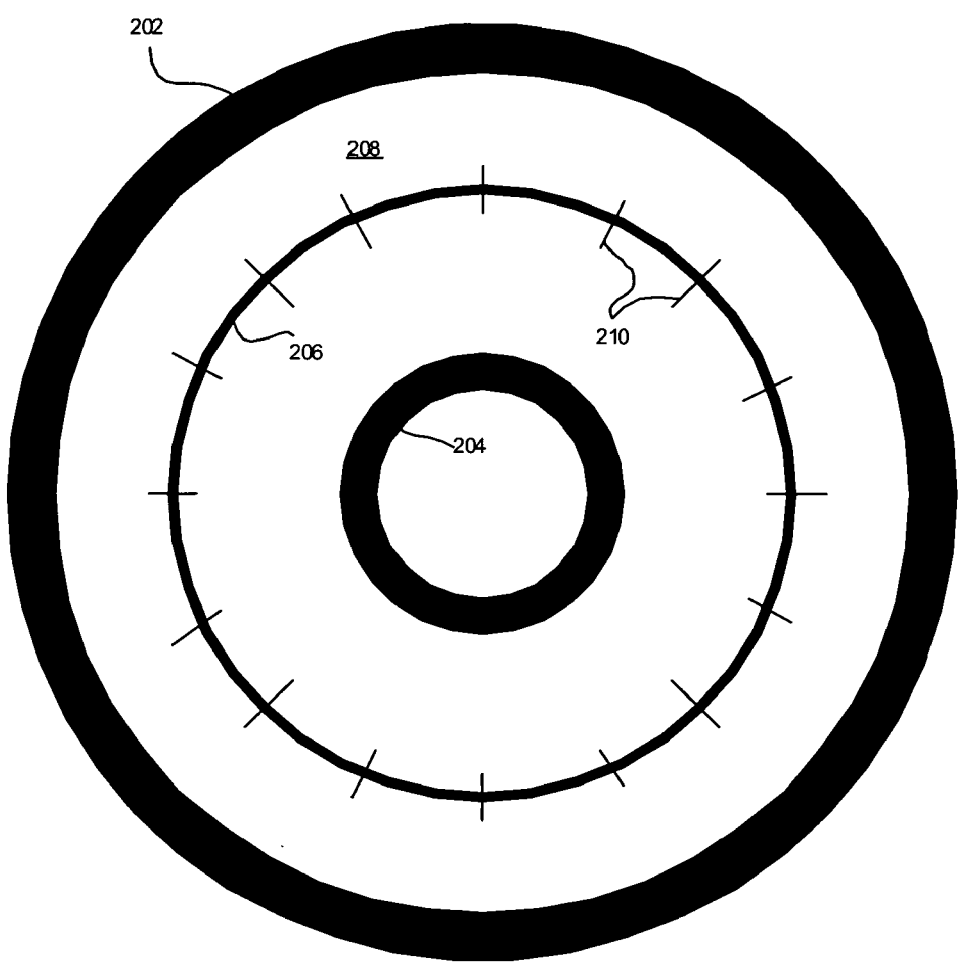
FIG. 2 is an end view of a dual cathode EUV electrode according to a first embodiment of the invention.
Figure 3B:
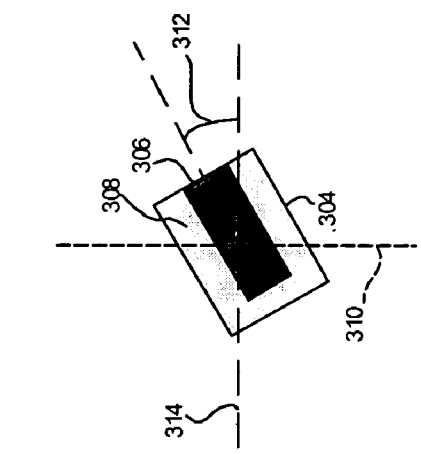
FIG. 3B is a side view of an element of a multiple electrode ring illumination source according to a second embodiment of the invention.
Figure 3A:
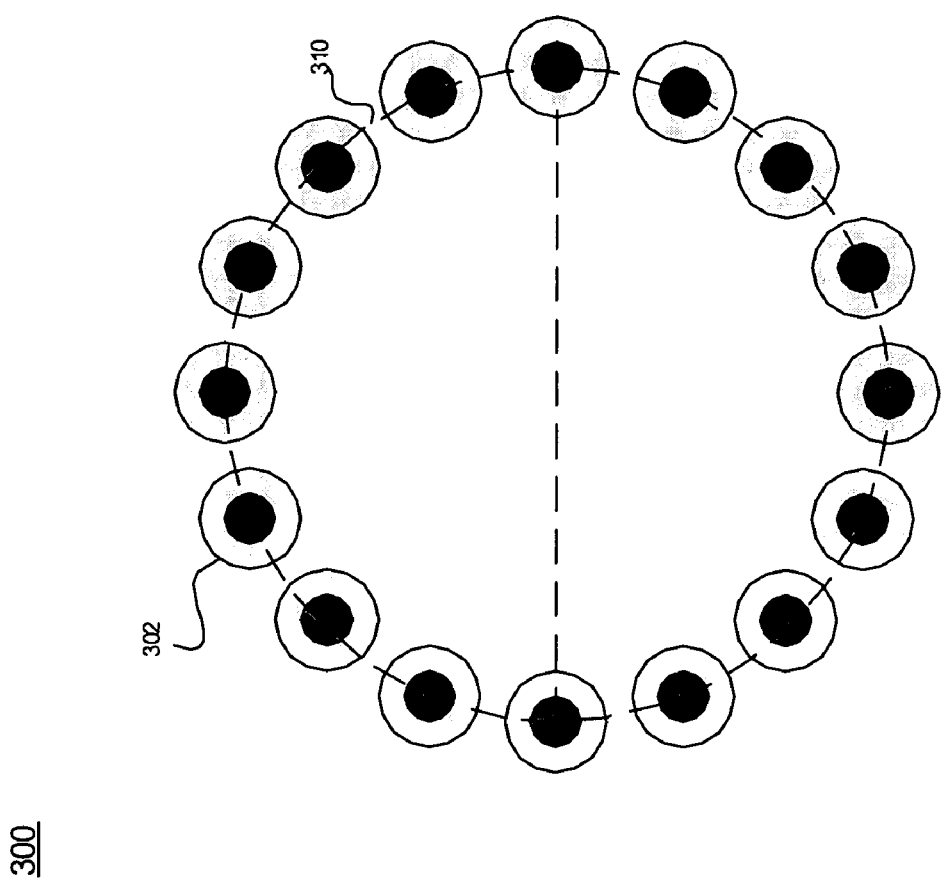
FIG. 3A is an end view of a multiple electrode ring illumination source comprising several individual DPF style electrodes according to a second embodiment of the invention.

The electrodes shown in FIGS. 2 and 3A are shown using a view along a line A 128. These are end views to show the area from which the EUV photons will be generated. The views are shown projecting toward the mirrors 210.

FIG. 2 illustrates a dual cathode EUV electrode 200 according to a first embodiment of the invention. The dual cathode electrode 200 includes an outer cathode 202, an inner cathode 204, and an anode 206 disposed in between the two cathodes 202 and 204. A plasma 208 is disposed in between the two cathodes 202 and 204. The plasma 208 will generate the EUV photons in the proximity of the anode 206 when the plasma 208 is excited by the voltage driven between the two cathodes 202 and 204 and the anode 206. The inner 204 and outer cathodes 202, and the anode 206 may be circular according to one embodiment of the invention.

According to one embodiment, the dual cathode electrode 200 may have a radius of 6.5 cm. However, it is understood that any size electrode may be used as necessary. The outer cathode 202, inner cathode 204, and the anode 206, may be formed from good conductors exhibiting high melting points. For example, the cathodes 202 and 204 and the anode 206 may be formed from tungsten, copper, or from binary alloys such as a molybdenum-copper alloy. A single power source may be used to activate the dual cathode electrode 200. The cathodes 202 and 204, for example, may be connected with a common ground, while the anode 206 is driven by a voltage relative to that ground. It is understood that other configurations may be used.

When a current is driven between the two cathodes 202 and 204 and the anode 206, a force is also created by the cross product of the current and the magnetic field generated by the current (hereinafter 'j×B'). When a current encounters (j) a magnetic field (B), a force is created. The force is created in the direction of, and having the magnitude of, the cross product of the j and B vectors. This j×B effect causes the plasma 208 to move toward the top of the anode 206 (out of the page or toward the mirrors 110 in FIG. 1). By driving the plasma 208 from both sides, or away from both cathodes 202 and 204, a concentrated ring of photons in the area of the anode 206 will be generated.

The anode 206 includes several pre-ionization pins 210, which are merely radial extensions of the anode 206. The pre ionization pins 210 serve as "pinch points" for the plasma when the current is applied. In other words, the pre-ionization pins 210 are the areas in which the EUV photons are generated. The pre-ionization pins 210 can be thought of as "igniters," in that the plasma initiates off the pre-ionization pins 210.

As mentioned above, the electrode 200 may substituted in place of the source plasma 102 as used in FIG. 1. Since the plasma 208 will be driven toward the anode 206, the EUV photons generated by the electrode 208 are generated around a ring, rather than over the entire surface of the electrode 200. As can be seen in FIG. 1, by generating the EUV photons near a ring that is roughly as large or larger than the obscuration 112, the photons generated will strike the mirrors 110 and not the obscuration 112, thereby significantly increasing the transmission rate of the photons generated by the electrode 200. As a result, EUV photolithography is more viable since it is easier to generate the light energy necessary to expose the photoresist 106.

FIGS. 3A and 3B illustrate a multiple electrode ring illumination source 300 comprising several individual DPF style electrodes 302. As explained above, the DPF electrodes 302 include an outer cathode 304, and an inner anode 306. The anode 306 is surrounded by a plasma 308. When the electrode 302 is activated, an arc is generated between the cathode 304 and the anode 306, and the plasma 308 is excited, thereby generating EUV photons. As mentioned above, in isolation, each singular electrode 302 creates light energy traveling in a single direction which may often be absorbed by the obscuration 112.

Several electrodes 302 may be positioned on a circle 310, thereby forming the multiple electrode ring illumination source 300. Like the dual cathode electrode 200 described above, the light is generated about the circle 310, which ensures that less light generated by the multiple electrode ring illumination source 300 is absorbed by the obscuration 112. Also, like the dual cathode electrode 200 described above, the multiple electrode ring illumination source 300 may be substituted in place of the source plasma 102. According to an embodiment of the invention, the individual electrodes 302 may have a radius of 1.25 cm, and the circle 310 may have a radius of 6.5 cm. However, it is understood that various different sizes may be used with the embodiments of the invention.

Each individual electrode 302 may use its own power supply. Alternatively, the electrodes 302 may share a common power supply. When using a common power supply, the cathodes 304 of the several electrodes 302 may be tied to a common ground and the anodes 306 of the several electrodes 302 may be tied to a common voltage source.

Since, as mentioned above, EUV photons are directional, the individual electrodes 302 may be aimed at the mirrors 110 to increase the amount of light transmitted. This is shown in FIG. 3B. As shown in FIG. 3B, an individual electrode 302 is positioned at an angle 312 away from a normal of the circle 314. FIG. 3B is a view shown such that the electrode 302 is pointing toward the mirrors 110. As such, the electrode 302 may point over the obscuration 112. The angle 312 may therefore be chosen so the individual electrodes 302 are in the mirrors 110 such that the mirrors 110 collect a maximum amount of light energy.

Figure 4:
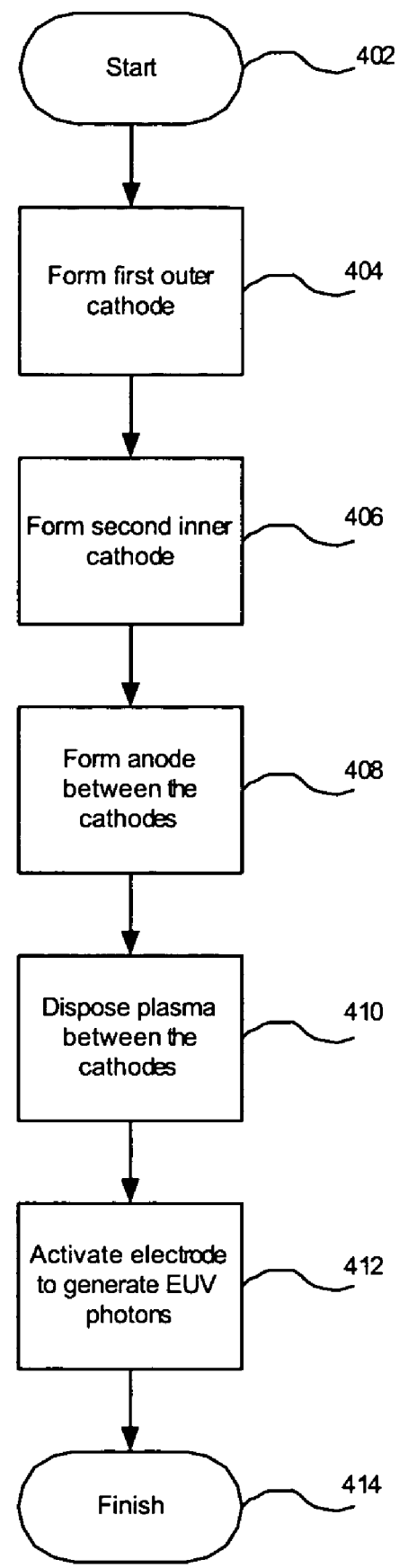
FIG. 4 is a flow chart describing a method for creating a dual cathode electrode as described above.

FIG. 4 is a flow chart describing a method for creating a dual cathode electrode 200 as described above. The process 400 begins at start block 402. In block 404, a first outer cathode is formed. The cathode, as well as the anode and second cathode, may be formed from good conductors exhibiting high melting points. For example, the first cathode may be formed from tungsten, copper, or from a binary alloy such as a molybdenum-copper alloy. In block 406, the second, inner cathode is formed. The second, inner cathode is smaller than the outer cathode and is placed inside the outer cathode. The inner and outer cathodes are electrically coupled so that they will commonly form an arc with the anode when activated.

In block 408, an anode is located between the two cathodes. The anode may be a ring including several pre ionization pins formed thereon. The anode may also be formed from strong, highly conductive material, as described above. In block 410, a plasma is disposed in between the two cathodes surrounding the anode. The plasma may be an element such as xenon, tin, or lithium, as described above.

In block 412, the electrode is activated. A current is driven between the two cathodes and the anode such that an arc is generated between the anode and two cathodes. For example, the anode may have a positive voltage relative to the two cathodes, which may be grounded. When the arc is generated, the plasma is excited such that the ions in the plasma are elevated to higher energy states, and they emit photons when the ions return to their stable energy states.

Figure 5:
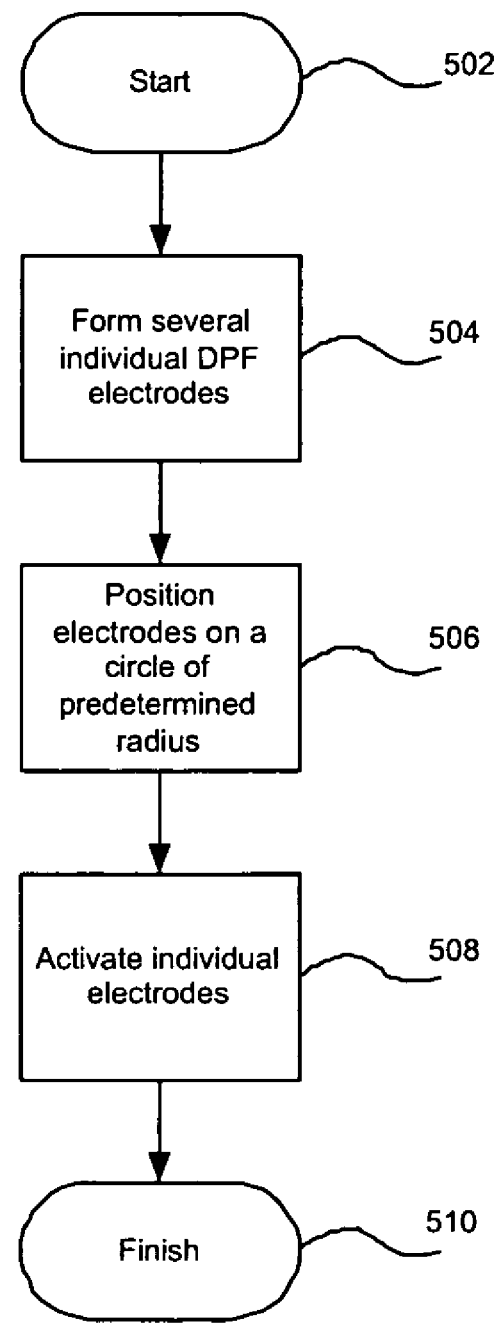
FIG. 5 is a flowchart describing a process for forming a multiple electrode ring illumination source according to an embodiment of the invention.

FIG. 5 is a flowchart describing a process for forming a multiple electrode ring illumination source according to an embodiment of the invention. The process 500 describes a technique for forming multiple electrode ring illumination source 300 as described above. The process 500 starts in block 502. In block 504, several individual DPF electrodes are formed. For example, as few as two electrodes may be used. FIG. 3A shows 16 electrodes to form an even dispersal of light. It is understood, however, that any number of electrodes may be used. The individual electrodes may be formed by uniting a cathode and an anode, and disposing a plasma in between the two.

In block 506, the several electrodes are positioned on a circle of a predetermined radius. The radius may be determined by the type of optics to be used, and by the size of the obscuration which will be used. For example, as described above, a radius of 6.5 cm may be used. In block 508, the individual electrodes are activated, so that the EUV photons may be generated as if they were all generated from the same circle. The process 500 uses known electrodes, which may be linked using several power supplies, as described above. The process 500 is finished in finish block 510.

This invention has been described with reference to specific exemplary embodiments thereof. It will, however, be evident to persons having the benefit of this disclosure that various modifications changes may be made to these embodiments without departing from the broader spirit and scope of the invention. The specification and drawings are accordingly to be regarded in an illustrative rather than in a restrictive sense.

What is claimed is:

1. An illumination source for photolithography comprising:
    an outer cathode;
    an inner cathode inside the outer cathode, wherein the inner cathode is concentrically aligned with the outer cathode;
    a ring-shaped anode between the outer and the inner cathode; and
    a plasma between the anode and the outer cathode and between the anode and the inner cathode, the plasma to generate electromagnetic radiation when a voltage between the cathodes and the anode is generated.

2. The illumination source of claim 1, further comprising:
    pre-ionization pins on the anode to create pinch points for generating the electromagnetic radiation.

3. The illumination source of claim 1, wherein the plasma is chosen from a group consisting of xenon, lithium, and tin.

4. The illumination source of claim 1, wherein the electromagnetic radiation comprises extreme ultraviolet (EUV) photons.

5. The illumination source of claim 1, wherein the inner cathode is electrically coupled to the outer cathode.

6. The illumination source of claim 1, further comprising:
    a set of mirrors to focus the electromagnetic radiation; and
    a reticle to mask the electromagnetic radiation.

7. The illumination source of claim 6, further comprising:
    a semiconductor substrate including a layer of photoresist that is exposed by the electromagnetic radiation.

8. The illumination source of claim 1, wherein the anode has a size chosen to maximize transmission around an obscuration.

9. An illumination source for photolithography comprising:
    a plurality of electrodes arranged on a circle to generate light by exciting a plasma internal to the electrodes; and
    an array of mirrors to collect the light and focus the light, and to distribute the light through a reticle and onto a semiconductor substrate.

10. The illumination source of claim 9, wherein the electrodes comprise:
    a circular cathode;

an anode inside the cathode; and a plasma disposed in between the cathode and the anode, the plasma to generate the light when an arc is generated between the cathode and the anode.

11. The illumination source of claim 9, wherein the electrodes generate an extreme ultraviolet (EUV) light.

12. The illumination source of claim 10, wherein the plasma is chosen from the group consisting of xenon, lithium, and tin.

13. The illumination source of claim 9, wherein the electrodes are positioned at an angle to the mirrors to maximize transmission of the light.

14. The illumination source of claim 10, wherein the electrodes comprise dense plasma focus (DPF) electrodes.

15. The illumination source of claim 9, wherein the circle has a size chosen to maximize transmission around an obscuration.

16. A method for generating illumination for photolithography comprising:

forming an outer cathode;

forming an inner cathode inside the outer cathode, wherein the inner cathode is concentrically aligned with the outer cathode;

forming a ring-shaped anode between the inner cathode and the outer cathode;

disposing a plasma between the inner cathode and the outer cathode; and producing an arc between the anode and the cathodes to excite the plasma and generate electromagnetic radiation.

17. The method of claim 16, wherein producing an arc comprises:

producing an arc between the anode and the cathodes to excite the plasma and generate EUV photons.

18. The method of claim 16, wherein the inner cathode, outer cathode, and anode are formed from a material chosen from the group consisting of tungsten, copper, or a molybdenum-copper allow.

19. The method of claim 16, further comprising:

forming pre-ionization pins on the anode.

20. The method of claim 19, wherein forming pre-ionization pins comprises:

forming the pre-ionization pins radial to a center of the inner cathode.

21. The method of claim 16, wherein the inner and outer cathodes and the anode are circular.

22. A method for generating illumination for photolithography comprising:

forming a plurality of dense plasma focus (DPF) electrodes to generate EUV light;

locating the DPF electrodes on a circle having a radius chosen to maximize transmission of the EUV light around an obscuration;

generating EUV light using the DPF electrodes; and directing the light toward a set of focusing mirrors.

23. The method of claim 22, further comprising:

directing the light onto a photoresist layer on a semiconductor substrate.

24. The method of claim 22, wherein forming a plurality of DPF electrodes comprises:

forming an outer cathode;

forming an inner anode inside the outer cathode; and disposing a plasma in between the anode and the cathode.

25. The method of claim 22, further comprising:

angling the electrodes so as to maximize the transmission of the EUV light to the focusing mirrors.

* * * * *